United States Patent [19]
Levy

[11] Patent Number: 5,126,008
[45] Date of Patent: Jun. 30, 1992

[54] CORROSION-FREE ALUMINUM ETCHING PROCESS FOR FABRICATING AN INTEGRATED CIRCUIT STRUCTURE

[75] Inventor: Karl B. Levy, Los Altos, Calif.

[73] Assignee: Applied Materials, Inc., Santa Clara, Calif.

[21] Appl. No.: 695,360

[22] Filed: May 3, 1991

[51] Int. Cl.⁵ .................................. H01L 21/00
[52] U.S. Cl. ........................ 156/665; 156/643; 156/646
[58] Field of Search .................. 156/643, 646, 665

[56] References Cited
U.S. PATENT DOCUMENTS

| | | | |
|---|---|---|---|
| 3,994,793 | 11/1976 | Harvilchuck et al. | 156/646 |
| 4,026,742 | 5/1977 | Fujino et al. | 156/643 |
| 4,214,946 | 7/1980 | Forget et al. | 156/646 |
| 4,308,089 | 12/1981 | Iida et al. | 156/665 |
| 4,351,696 | 9/1982 | Radigan | 156/665 |
| 4,556,628 | 12/1985 | Greschner et al. | 156/643 |
| 4,592,800 | 6/1986 | Landau et al. | 156/643 |
| 4,657,619 | 4/1987 | O'Donnell | 156/643 |
| 4,668,335 | 5/1987 | Mockler et al. | 156/643 |
| 4,948,462 | 8/1990 | Rossen | 156/643 |

Primary Examiner—David A. Simmons
Assistant Examiner—George Goudreau
Attorney, Agent, or Firm—John P. Taylor

[57] ABSTRACT

A process is described for plasma-assisted etching of an aluminum layer to form aluminum lines while fabricating an integrated circuit structure on a semiconductor wafer using one or more bromine-containing etch gases, and optionally $SF_6$ in combination with the bromine-containing gas or gases, which will not result in the formation of corrosive residues such as normally occurs when chlorine-based etchants are used.

18 Claims, 1 Drawing Sheet

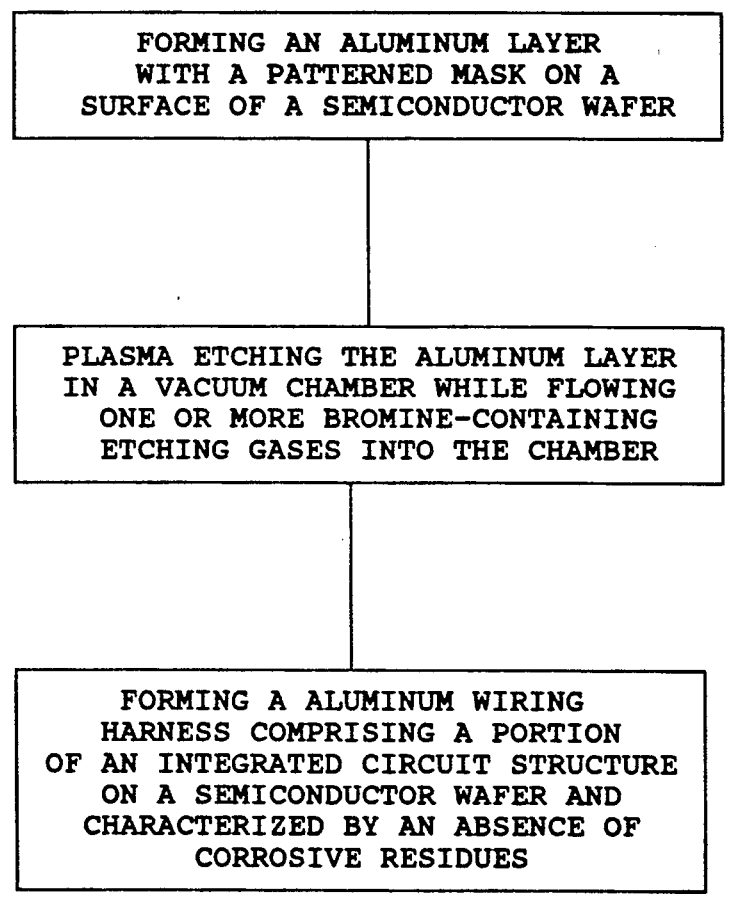

CORROSION-FREE ALUMINUM ETCHING PROCESS FOR FABRICATING AN INTEGRATED CIRCUIT STRUCTURE

BACKGROUND OF THE INVENTION

1. Field of the Invention

This invention relates to a process for etching an aluminum layer. More particularly, this invention relates to a process for etching an aluminum layer, using one or more bromine-containing etch gases to form a pattern of aluminum during the fabrication of an integrated circuit structure on a semiconductor wafer without incurring the risk of corrosion problems normally encountered in etch processes using chlorine-containing etchants.

2. Description of the Related Art

Conventional plasma etching of an aluminum layer in the fabrication of integrated circuit structures on semiconductor wafers utilizes $Cl_2$ or a chlorine-containing gas, either of which can leave chlorine-containing residues on the remaining aluminum. While such a chlorine based etchant system is effective in etching away unmasked aluminum to form, for example, an aluminum wiring harness for an integrated circuit structure, chlorine residues which remain after the etch can result in corrosion of the aluminum lines upon subsequent exposure to air/$H_2O$.

The corrosion reaction degrades aluminum line continuity, and with a supply of $H_2O$ (air), the reaction feeds itself, as shown in the following representative reactions:

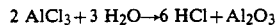

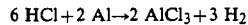

Sometimes the chlorine residues are contained (trapped) in sidewall materials which are deliberately formed on the sidewall of the aluminum line during the etch to inhibit undercutting of the aluminum line beneath the photoresist mask during the etch.

Conventionally, such sidewall deposits, which usually comprise oxide/polymeric materials, as well as such chlorine residues, are removed along with removal of the resist mask. Other chlorine residues on the aluminum are removed by washing the entire structure. However, in some types of processing, it is not convenient to either remove the resist and sidewall deposits immediately, or to immediately wash the semiconductor wafer to remove the chlorine residues, e.g., while carrying out processing steps under vacuum. Also, the corrosion reaction may occur very quickly (on the order of seconds or minutes) precluding the possibility of removing the sidewall deposits and residues before corrosion occurs.

This continued presence of such chlorine residues on a semiconductor wafer and the corrosive reaction of such residues with the aluminum lines formed on the wafer during the etch step can result in subsequent disruption of the normal function of the integrated circuit structure, where loss of aluminum from the aluminum lines results in an inability of the remaining portions of the conductive aluminum lines to carry the required electrical current. The corrosion reaction may continue slowly in the finished, packaged part, leading eventually to premature failure, limiting the overall reliability.

It would, therefore, be advantageous to provide a process for the selective etching of a masked aluminum layer to form aluminum lines without using chlorine-based etchants which leave corrosive chlorine residues on and in the integrated circuit structure formed on the semiconductor wafer.

SUMMARY OF THE INVENTION

It is, therefore, an object of this invention to provide a process for etching aluminum while fabricating integrated circuit structures on semiconductor wafers without leaving corrosive chlorine residues on the wafer.

It is another object of this invention to provide a process for etching an aluminum layer on an integrated circuit structure to form a pattern of aluminum which comprises etching the aluminum layer with a bromine-containing etchant.

These and other objects of the invention will become apparent from the following description and accompanying flow sheet.

BRIEF DESCRIPTION OF THE DRAWING

The sole drawing is a flow sheet which illustrates the process of the invention.

DETAILED DESCRIPTION OF THE INVENTION

The invention comprises a process for etching an aluminum layer comprising an aluminum base alloy formed on a semiconductor wafer in the course of fabricating an integrated circuit structure thereon, using a bromine-containing etch gas which will not result in the formation of corrosive residues such as normally occurs when chlorine-based etchants are used to pattern the aluminum layer.

By use of the term "aluminum base alloy" is meant a metal containing from at least about 50 wt.% up to 100 wt.% aluminum. Usually the aluminum base alloy will comprise at least about 95 wt.% aluminum, with the balance of the alloy usually comprising copper (up to a maximum of about 4 wt.%) and silicon (up to a maximum of about 2 wt.%). For illustrative purposes, and not by way of limitation, the aluminum base alloy will be referred to hereinafter as an aluminum layer, it being understood that such terminology is not meant to exclude the use of any aluminum base alloy as that term is defined above.

The aluminum layer is conventionally applied to the surface of an integrated circuit structure and a patterned photoresist etch mask is then formed over the aluminum layer. The aluminum layer is then etched, in accordance with the invention, in a vacuum chamber using a plasma-assisted etch with one or more bromine-containing gases.

Bromine-containing gases which may be used singly or in mixtures in the plasma-assisted etch include, for example, $BBr_3$, $HBr$, $Br_2$, $CF_3Br$, $CF_2Br_2$, $CFBr_3$, $CBr_4$, $CHBr_3$, $CH_2Br_2$, and $CH_3Br$. Other gases, which may be optionally included in the etching gas mixture as carrier gases, diluents, etc., may comprise non-reactive gases such as helium, oxygen, or argon.

In accordance with one aspect of the invention, the bromine-containing gas or gases may be used in combination with $SF_6$ gas in an amount of from about 1 to about 30 volume percent $SF_6$ gas, based on the total volume of the etchant gas or gases and $SF_6$. The use of $SF_6$ gas, in combination with the bromine-containing gas or gases, has been found to enhance the etch rate of the bromine-containing gas or gases. For example, when $SF_6$ was added to $BBr_3$ in an amount of about 25 volume % of the combined total of $SF_6$ and $BBr_3$, the etch rate was found to increase by about 100%, i.e., the etch rate doubled. While it is not the intent to be bound by any theories of operation, it is thought that this observed beneficial effect of the addition of $SF_6$ may be due to the $SF_6$ gas driving surface reactions catalytically or by gas phase catalysis to form the very stable $AlF_3$.

The vacuum chamber in which the etch process is carried out should be maintained at a vacuum ranging from about 2 to about 100 milliTorr, while the temperature in the chamber may range from about 0° C. up to about 150° C, preferably from about 70° C. to about 100° C. to minimize deposits in the chamber.

The etchant gas or gas mixture is flowed into the vacuum etch chamber at a rate equivalent to a flow rate of from about 10 standard cubic centimeters per minute (sccm) to about 200 sccm into a 10 liter chamber. The actual size of the vacuum etch chamber and the flow rate will, together with the capacity of the vacuum pump, be sized to permit the etch chamber to be maintained within the desired vacuum range and within the desired equivalent etching gas flow rate range.

After the substrate containing the masked aluminum layer to be etched has been positioned in the etch chamber and the etch gas flow has commenced, a plasma is ignited in the chamber between the base or cathode on which the wafer rests and the grounded electrode and walls of the chamber. The plasma power is maintained during the etch at a power level equivalent to from about 100 to about 500 watts for a 150 millimeter ($\sim$6 inch) wafer, i.e., at a power level of from about 0.5 to about 2.75 watts/cm$^2$. Magnetic enhancement of the plasma can also be used, with a field strength between 0 and about 200 gauss with the direction of the magnetic field parallel to the wafer surface, using magnetic coils horizontally spaced around the outside walls of the vacuum chamber, as is well known to those skilled in the art. Examples of such apparatus may be found in U.S. Pat. Nos. 4,668,338 and 4,842,683, both assigned to the assignee of this invention, and cross-reference to both of which is hereby made. Usually the aluminum layer to be etched will be formed over an insulating layer such as $SiO_2$ which will act as an etch stop for the etch process. However, to avoid excessive etching of the aluminum over contact areas, i.e., where there is no such etch stop, the time of the etch process should be monitored as well. The thickness of the deposited aluminum layer will usually vary from about 5000 to about 25000 Angstroms and the etch process of the invention is capable of removing from about 20 to about 200 Angstroms of aluminum per second. Therefore, the process may be carried out for a time period ranging from 25 seconds to about 20 minutes depending upon the thickness of the aluminum layer.

While it is not the intent to be bound by any theories as to why the use of bromine-based etchants, in accordance with the invention, does not result in a corrosive attack of the aluminum layer as does the prior art use of chlorine-based etchants, it is postulated that the higher vapor pressure of the bromine/aluminum reaction products, e.g., $AlBr_3$, at temperatures up to about 130° C., compared to the vapor pressure of the analogous chlorine/aluminum reaction product, $AlCl_3$, may result in volatilization of the bromide salts, thereby leaving no corrosive residues on the photoresist or aluminum surfaces, unlike the prior art chlorine-based etch process. Also, $AlBr_3$ is a weaker Lewis acid than is $AlCl_3$, which may also contribute to a lower reactivity of any bromine-based residues on the wafer after the etch process.

To further illustrate the process of the invention, a 10,000 Angstrom layer of an aluminum alloy, containing 1 wt.% copper and 0.5 wt.% silicon, was deposited over a 5000 Angstrom thick oxide layer on a "6 inch wafer" and a patterned photoresist etch mask was formed over the aluminum layer. The aluminum layer was then etched in a plasma etching chamber maintained at a pressure of 20 milliTorr and a temperature of about 100° C. by flowing about 30 sccm of $BBr_3$ into the chamber and igniting a plasma which was then maintained at a power level of 300 watts during the etch. A rotating magnetic field was used with a field strength parallel to the wafer of approximately 100 gauss. The etching step was carried out for 360 seconds.

The wafer was then removed from the vacuum chamber and exposed to moist air without removing the photoresist mask and without any rinsing of the etched surface to remove etch residues. After five days of exposure, the etched aluminum pattern was then examined under a scanning electron microscope (SEM) for evidence of corrosive attack of the aluminum lines, i.e., for any narrowing of the aluminum lines to less than the originally etched width, or pitting of the sidewall, or $Al_2O_3$ "bubbles" protruding from the sidewall.

There was no evidence of any attack of the aluminum by any etchant residues which may have been present either in or on the photoresist mask or on any of the exposed aluminum surfaces such as the sidewalls of the aluminum lines. The experiment was successfully repeated three times to verify the results.

Thus, the etch process of the invention substantially eliminates the problem of corrosion of aluminum lines, after the aluminum etching step, during fabrication of an integrated circuit structure on a semiconductor wafer, by substituting one or more bromine-based etchant gases for the chlorine-based etch gases previously used in the prior art to pattern the aluminum layer.

Having thus described the invention what is claimed is:

1. A process for etching aluminum on a semiconductor wafer without forming corrosive residues which comprises etching the aluminum in a vacuum chamber using:
   a) one or more bromine-containing gases selected from the group consisting of $BBr_3$, HBr, $Br_2$, $CF_3Br$, $CF_2Br_2$, $CFBr_3$, $CBr_4$, $CHBr_3$, $CH_2Br$, and mixtures of same; and
   b) $SF_6$ gas in an amount equal to from about 1 to about 30 volume % of the combined total of said one or more bromine-containing gases and said $SF_6$ gas;

to thereby etch said aluminum layer without leaving corrosion-forming chlorine etch residues on said semiconductor wafer.

2. The process of claim 1 wherein said one or more bromine-containing gases are flowed into said vacuum chamber at a rate equivalent to from about 10 to about 200 sccm flowing into a 10 liter vacuum chamber.

3. The process of claim 2 wherein a plasma is ignited in said vacuum chamber during said etching.

4. The process of claim 3 wherein the power level of said plasma in said chamber is maintained within a range of from about 0.5 to about 2.75 watts per cm² of wafer area.

5. The process of claim 3 wherein said wafer is immersed in a magnetic field horizontal to the plane of said wafer during said etch.

6. The process of claim 5 wherein the strength of said magnetic field ranges from 0 to about 200 gauss.

7. The process of claim 5 wherein the pressure in said vacuum chamber is maintained with a range of from about 2 to about 100 milliTorr.

8. The process of claim 7 wherein the temperature in said vacuum chamber is maintained within a range of from about 0° to about 150° C.

9. The process of claim 7 wherein the temperature in said vacuum chamber is maintained within a range of from about 70° C. to about 100° C.

10. A process for etching an aluminum layer on a semiconductor wafer, having a patterned photoresist mask formed over said aluminum layer, without forming corrosive residues which comprises:
 (a) inserting said wafer into a vacuum etch chamber maintained at a pressure within a range of from about 2 to about 100 milliTorr and at a temperature within a range of from about 0° to about 150° C.;
 (b) flowing into said vacuum etch chamber one or more bromine-containing gases selected from the group consisting of BBr₃HBr, Br₂, CF₃Br, CF₂Br₂, CFBr₃, CBr₄, CHBr₃, CH₂Br₂, CH₃Br, and mixtures of same;
 (c) flowing SF₆ gas into said vacuum etch chamber in an amount equal to from about 1 to about 30 volume % of the combined total of said one or more bromine-containing gases and said SF₆ gas;
 (d) igniting a plasma in said vacuum etch chamber; and
 (e) optionally immersing said wafer in a magnetic field parallel to the plane of the wafer;
to thereby etch said masked aluminum layer without leaving corrosion-forming chlorine etch residues on said semiconductor wafer.

11. The process of claim 10 wherein said one or more bromine-containing gases are flowed into said vacuum chamber at a rate equivalent to from about 10 to about 200 sccm flowing into a 10 liter vacuum chamber.

12. The process of claim 10 wherein the power level of said plasma in said chamber is maintained within a range of from about 0.5 to about 2.75 watts per of wafer area.

13. The process of claim 10 wherein the field strength of said optional magnetic field ranges from 0 to about 200 gauss.

14. The process of claim 10 wherein said bromine-containing gas comprises BBr₃.

15. A process for etching an aluminum layer while fabricating an integrated circuit structure on a semiconductor wafer, having a patterned photoresist mask formed over said aluminum layer, without forming corrosive residues which comprises:
 (a) positioning said wafer in a vacuum etch chamber maintained at a pressure within a range of from about 2 to about 100 milliTorr and a temperature within a range of from about 70° C. to about 100° C.;
 (b) flowing into said vacuum etch chamber at a rate equivalent to from about 10 to about 200 sccm flowing into a 10 liter vacuum chamber, one or more bromine-containing gases selected from the group consisting of BBr₃, HBr, Br₂, CF₃Br, CFBr₃, CBr₃, CBr₄, CHBr₃, CH₂Br₂, CH₃Br, and mixtures of same;
 (c) flowing into said vacuum etch chamber, with said one or more bromine-containing gases, SF₆ gas in an amount ranging from about 1 to about 30 volume % of the combined total of said SF₆ and said one or more bromine-containing gases;
 (d) igniting a plasma in said vacuum etch chamber;
 (e) maintaining said plasma in said vacuum chamber during said etch at a power level within a range of from about 0.5 to about 2.75 watts per cm² of wafer area;
 (f) optionally immersing said wafer during said etch in a magnetic field parallel to the plane of the wafer and having a field strength ranging from 0 to about 200 gauss; and
 (g) carrying out said etch for a period of from about 25 seconds to about 20 minutes;
thereby etch said masked aluminum layer at an increased etch rate over the use of said one or more bromine-containing gases without said SF₆ gas, without leaving corrosion-forming chlorine etch residues on said integrated circuit structure.

16. The process of claim 15 wherein said bromine-containing gas comprises BBr₃.

17. A process for etching an aluminum layer to form a pattern of aluminum lines while fabricating an integrated circuit structure on a semiconductor wafer, without forming corrosive residues which comprises:
 (a) forming a patterned photoresist mask over said aluminum layer on said wafer;
 (b) inserting said wafer into a vacuum etch chamber maintained at a pressure within a range of from about 2 to about 100 milliTorr and a temperature within a range of from about 70° C. to about 100° C.;
 (c) flowing into said vacuum etch chamber at a rate equivalent to from about 10 to about 200 sccm flowing into a 10 liter vacuum chamber:
  (i) one or more bromine-containing gases selected from the group consisting of BBr₃, HBr, Br₂, CF₃Br, CF₂Br₂, CFBr₃, CBr₄, CHBr₃, CH₂Br₂, CH₃Br, and mixtures of same; and
  (ii) SF₆ gas in an amount equal to from about 1 to about 30 volume % of the combined total of said one or more bromine-containing gases and said SF₆ gas;
 (d) igniting a plasma in said chamber;
 (e) maintaining said plasma in said vacuum chamber during said etch at a power level within a range of from about 0.5 to about 2.75 watts per cm² of wafer area; and
 (f) optionally immersing said wafer during said etch in a magnetic field parallel to the plane of the wafer and having a field strength ranging from 0 to about 200 gauss.

18. The process of claim 17 wherein the amount of said SF₆ gas flowing into said chamber comprises about 25 volume % of the combined total of said SF₆ and said BBr₃ gas to provide an etch rate approximately twice the etch rate obtained using BBr₃ gas along as the etchant gas.

* * * * *